(12) United States Patent
Haruta et al.

(10) Patent No.: US 6,369,662 B1
(45) Date of Patent: Apr. 9, 2002

(54) OSCILLATOR, DIELECTRIC WAVEGUIDE DEVICE, AND TRANSMITTER

(75) Inventors: Kazumasa Haruta, Nagaokakyo; Sadao Yamashita, Kyoto, both of (JP)

(73) Assignee: Murata Manufactoring Co., Ltd. (JP)

( * ) Notice: Subject to any disclaimer, the term of this patent is extended or adjusted under 35 U.S.C. 154(b) by 0 days.

(21) Appl. No.: 09/430,650

(22) Filed: Oct. 29, 1999

(30) Foreign Application Priority Data

Oct. 29, 1998 (JP) .......................................... 10-308380

(51) Int. Cl.$^7$ ................................................ H03B 9/12
(52) U.S. Cl. .................. 331/107 G; 331/175; 331/176; 331/66; 331/107 SL; 331/99; 333/238
(58) Field of Search .............................. 331/107 SL, 99, 331/107 G, 175, 176, 66; 333/219.1, 238, 239

(56) References Cited

U.S. PATENT DOCUMENTS 4,307,352 A * 12/1981 Shinkawa et al. ............ 331/99
4,728,907 A * 3/1988 Cohen .................... 331/107 R

FOREIGN PATENT DOCUMENTS

JP     06350341 A     12/1994

OTHER PUBLICATIONS

German Search Report, Feb. 19, 2001.

* cited by examiner

Primary Examiner—Arnold Kinkead
(74) Attorney, Agent, or Firm—Ostrolenk, Faber, Gerb & Soffen, LLP

(57) ABSTRACT

An oscillator, a dielectric waveguide device and a transmitter incorporating the same, wherein a special temperature-compensating circuit provides a temperature-compensated device with reduced size and cost, and greater productivity. In the oscillator, a dielectric plate having a strip line of a specified length is arranged between conductive plates which enclose a Gunn diode. The oscillation output signal of the Gunn diode is extracted via the strip line. In addition, the sign of the dielectric-constant temperature coefficient of the dielectric plate is set such that changes in the oscillation frequency caused by changes in temperature of the Gunn diode are suppressed.

13 Claims, 5 Drawing Sheets

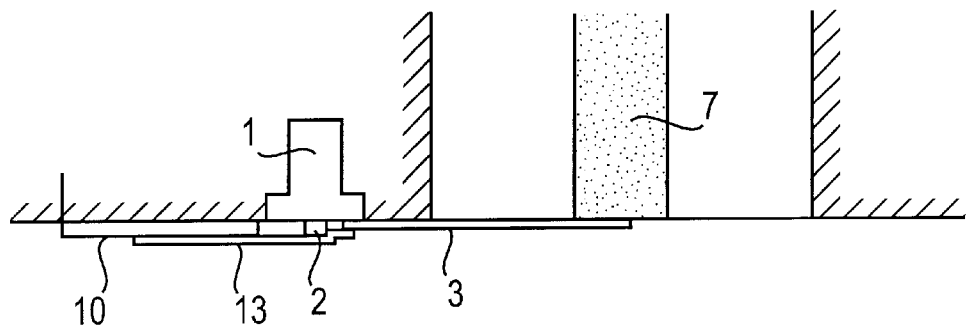
FIG. 2A
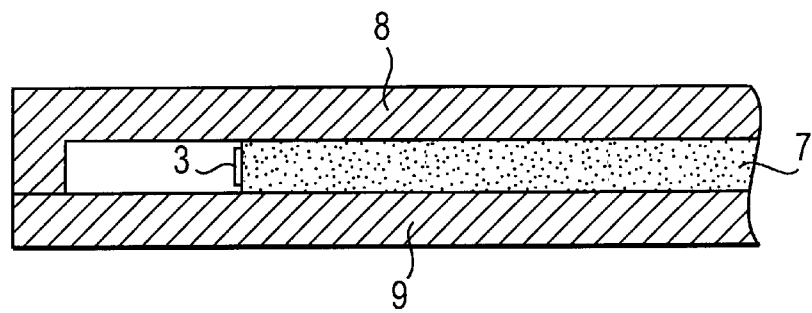
FIG. 2B
| | | TEMPERATURE [°C] | |
|---|---|---|---|
| | | 25 | 80 |
| NON-COMPENSATED | f[GHz] | 60 | 59.8 |
| COMPENSATED | z[Ω] | 26.706 | 26.822 |
| | λg[mm] | 1.714 | 1.723 |
| | f[GHz] | 60 | 60.01 |
FIG. 3

OSCILLATOR, DIELECTRIC WAVEGUIDE DEVICE, AND TRANSMITTER

BACKGROUND OF THE INVENTION

1. Field of the Invention

The present invention relates to an oscillator, a dielectric waveguide device and a transmitter incorporating the same. More particularly, the invention relates to an oscillator for use at a high-frequency such as a millimeter wave or a micro-wave, in which the temperature dependence of an oscillation frequency is small, and a dielectric waveguide device and a transmitter incorporating the same.

2. Description of the Related Art

A millimeter-wave oscillator is an example of a high-frequency oscillator. The millimeter-wave oscillator is used, for example, in a vehicle-collision-avoidance radar system. In a typical type of millimeter-wave oscillator, a solid-state oscillating element such as a Gunn diode is often used.

In this case, an oscillation signal outputted from a Gunn diode is guided to a dielectric resonator via a dielectric waveguide, which electromagnetically couples to the dielectric resonator. In this arrangement, the dielectric resonator acts as a primary radiator to radiate the oscillation signal to an object.

FIG. 8 shows an equivalent circuit diagram of an oscillator using a Gunn diode. The oscillator shown in FIG. 8 is a reflector-type oscillator.

The section surrounded by a dotted line is the equivalent circuit of the Gunn diode, which includes a negative resistor −R and a reactor L1 connected in parallel to a capacitor C1, and a capacitor C2 connected in parallel to the negative resistor.

In addition, the oscillator further includes an excitation waveguide with a characteristic impedance Z1 and an electric length 1, and a load.

FIG. 9 shows the temperature dependence of an oscillation frequency of the oscillator. As shown in the figure, the oscillation frequency is reduced as the temperature rises. In general, the oscillation frequency of a Gunn diode varies in the range of approximately 50 to −100 ppm/° C. Such temperature dependence of the oscillation frequency is considered to stem from the temperature dependence of the negative resistor −R.

In radar systems, stabilization of the oscillation frequencies of oscillators is of critical concern.

For example, Japanese Unexamined Patent Publication No. 6-268445 provides an oscillator constituted of a Gunn diode and a metal strip resonator. In the arrangement of the oscillator, the output from the oscillator is transmitted to a nonradiative dielectric waveguide, near which is disposed a modulator in which a dielectric resonator is placed close to a variable capacitance diode mounted on a nonradiative dielectric member. The oscillation frequency of the output from the oscillator can be changed by controlling the modulator.

In addition, there is provided a method for controlling the oscillation frequency by changing a bias voltage applied to a Gunn diode according to the ambient temperature.

However, in the former method, the modulator including the dielectric resonator needs to be disposed in such a manner that the modulator is not in contact with the nonradiative dielectric waveguide. In the latter method, it is necessary to provide a temperature-compensating circuit for the bias voltage. Therefore, the conventional art has problems in terms of reduction in size of the device.

SUMMARY OF THE INVENTION

To address these problems, the present invention provides an oscillator, a dielectric waveguide device and a transmitter incorporating the same which includes a special temperature-compensating circuit in order to solve problems such as increase in size, reduction in productivity, and rise in cost.

According to an aspect of the present invention, there is provided an oscillator including an oscillating element whose oscillation frequency exhibits temperature dependence, a dielectric substrate, and a transmission line disposed thereon, which has an input section for receiving an output from the oscillating element and an output section. The dielectric constant of the dielectric substrate exhibits temperature dependence so as to reduce the temperature dependence of an oscillation frequency from the output section.

For example, as a typical oscillating element, a Gunn diode is used. The oscillation frequency of the Gunn diode is lowered as the ambient temperature rises. But by setting the dielectric constant characteristics of the dielectric substrate appropriately, the electric length of the transmission line formed on the substrate is shortened in response to the temperature rise. As a result, the oscillation frequency outputted from the transmission line is increased. In other words, the temperature dependence of the oscillation frequency of the Gunn diode can be compensated for by using changes in the dielectric constant of the dielectric substrate.

For example, when the oscillation frequency of an oscillating element is lowered as the temperature rises, it is preferable to use a dielectric substrate whose dielectric constant decreases in response to the temperature rise.

In the present invention, the temperature dependence of the oscillation frequency of an oscillator can be lessened by appropriately selecting a material used for the dielectric substrate. In this case, it is only necessary to control the physical properties of the dielectric substrate engaging with the output line of the oscillator. Since no addition of temperature-compensating peripheral circuit is required, a compact oscillator can be obtained.

In short, it is only necessary to select an appropriate dielectric substrate according to the oscillation-frequency characteristics of the oscillator, and a Gunn diode may be used as the oscillating element in the invention.

Moreover, when the output signal of the oscillator is guided to an appropriate transmission line and is further guided to a radiator such as a dielectric resonator, a transmitter having good temperature-compensating characteristics can be produced.

Other features and advantages of the present invention will be described below, with reference to the drawings.

BRIEF DESCRIPTION OF THE DRAWINGS

FIG. 2A is a sectional view of the oscillator and the dielectric waveguide shown in FIG. 1A, in which the section is taken along the line passing through the Gunn diode, in parallel to the upper and lower conductors;

FIG. 2B is a sectional view of the dielectric waveguide shown in FIG. 1A, which is taken along a line passing through a dielectric strip, vertically to the upper and lower conductors;

FIG. 3 is a chart comparing the oscillation-frequency temperature dependence of an oscillator of the present invention with an oscillator of the conventional art;

DESCRIPTION OF EMBODIMENTS OF THE INVENTION

The structure of an oscillator according to a first embodiment of the present invention will be illustrated by referring to FIGS. 1A, 1B, 2A, 2B, and 3.

Figure 1A:
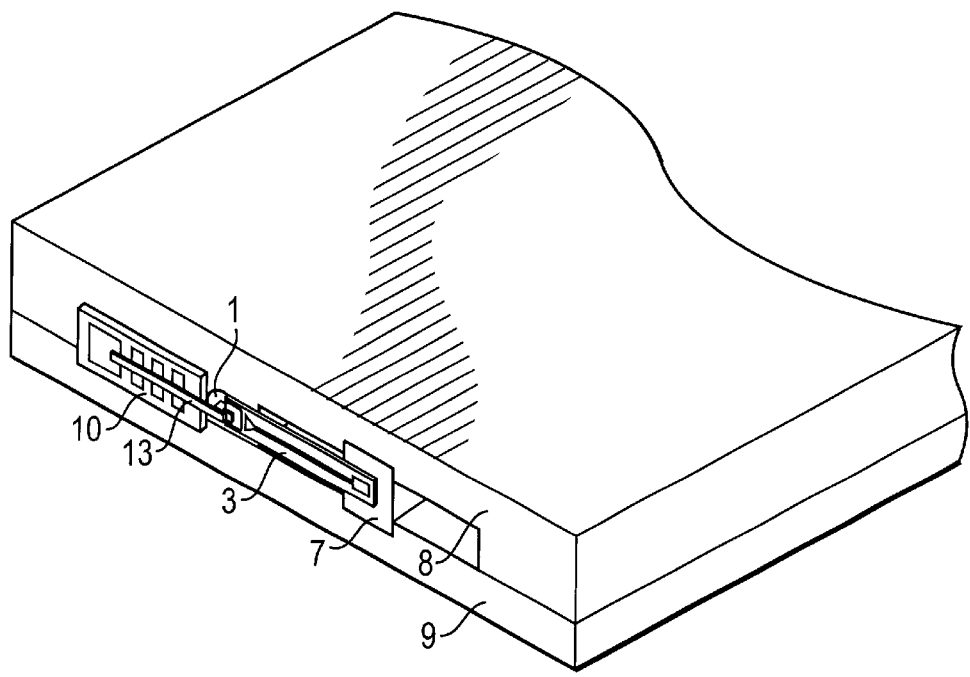
FIG. 1A is a partially cutaway perspective view of an oscillator and a dielectric waveguide connected thereto according to a first embodiment of the present invention.

In FIG. 1A, the main part of the oscillator comprises an oscillating element 1 and a strip line 5 for propagating an output signal from the oscillating element 1. The strip line 5 is disposed on a dielectric plate 3.

A Gunn diode is used as the oscillating element 1. A Gunn-diode chip, which is the typical type of Gunn diode, is enclosed by a pill-shaped package and is electrically connected to an output terminal 2, which is exposed outside the package. Although the placement of the package can arbitrarily be selected, the package in this embodiment is embedded in a metal conductor 8 in such a manner that only the output terminal 2 can be accessed from the outside.

The output terminal 2 is connected to a lead plate 13 for supplying a bias voltage to the Gunn diode 1. The other end of the lead plate 13 is connected to a bias terminal 11. A bias voltage is applied to the bias terminal 11 from the outside in a suitable way. At some points on the lead plate 13, between the bias terminal 11 and the output terminal 2, filters 12 are placed. The filters 12 include transmission lines formed of a plurality of micro-strip lines and an inductor and act as low pass filters. The lead plate 13, the bias terminal 11, the filters 12, and the output terminal 2 are connected by soldering or the like.

The lead plate 13, the bias terminal 11, and the filters 12 are formed on a single-piece substrate 10.

In short, as long as the external bias voltage can be supplied to the output terminal 2 of the Gunn diode, other modifications can be applied to the present invention.

The output terminal 2 of the Gunn diode is electrically connected to an electrode 4 on the dielectric plate 3. In this embodiment, the lead plate 13 is extended toward the direction of the dielectric plate 3 to reach the electrode 4 so that the output terminal 2 is electrically connected to the electrode 4. The lead plate 13 is mounted firmly to the substrate 10 via the filters 12. By using an elastic characteristic of the lead plate 13, the electrode 4 is pressed in a direction vertical to the main surface of the dielectric plate 3. The lead plate 13 is bent near the top of the output terminal 2 so as to extend in the direction in which the output terminal 2 extends, and then, near the electrode 4, is folded so as to make contact with the electrode 4, as shown in FIG. 2A. The bent portion has sufficient length that the contact between the bent portion and the electrode 4 bends the elastic plate 13 slightly in the direction away from the electrode 4, whereby the elasticity of the lead plate 13 presses the lead plate 13 against the electrode 4, and further, firmly fixes the dielectric plate 3 to the conductors 8 and 9.

The electrode 4 is opposed to the end of the strip line 5 with a distance therebetween. The end of the strip line 5 has a tapered shape extending toward the electrode 4. In this arrangement, the electrode 4 is electromagnetically coupled to the strip line 5 via a capacitance. The strip line 5 is extended toward one end of the dielectric plate 3 to form an open end 6.

Next, the operation of the oscillator will be described below.

A bias voltage is applied to the bias terminal 11 and to the output terminal 2 of the Gunn diode 1 by the lead plate 13 after filtering by the filters 12. The Gunn diode outputs an oscillation signal to the output terminal 2. The oscillation signal is transmitted to the electrode 4 and is guided to the strip line 5 via the capacitance and is conducted to the open end 6.

In order for the strip line 5 to act satisfactorily as an excitation waveguide, it is preferable for the line length between the electrode 4 and the open end 6 to be approximately ¼ of a wavelength of the oscillation signal.

The following equation indicates the relationship among the line length l of the strip line 5, an electric length $1_e$, and the dielectric constant $\in_r$ of the dielectric plate 3.

$$1_e = 1 \cdot \sqrt{\in_r}$$

Thus, by lowering the dielectric constant, the electric length is reduced. It is well known that the relationship between the electric length and the frequency of a signal propagated through a waveguide is in inverse proportion. Thus, as the dielectric constant of the dielectric plate 3 is lowered, the frequency of the propagated signal increases.

This finding can be used to compensate for the temperature dependence of the oscillation frequency of a Gunn diode.

More specifically, when it is found that the oscillation frequency of a Gunn diode varies with ambient temperature, it is possible to lessen the temperature dependence of the oscillation frequency outputted from the open end 6 by using a dielectric material whose dielectric constant varies with ambient temperature in the dielectric plate 3.

For example, when it is found that the oscillation frequency of a Gunn diode is lowered as temperature rises, the use of a dielectric plate 3 whose dielectric constant is reduced in response to the temperature rise allows the resulting increase and decrease in the oscillation frequency to compensate for each other, with the result that it is eventually possible to substantially cancel the temperature dependence of the frequency of an oscillation signal outputted from an oscillator.

Even in a case where the temperature characteristic of an oscillating element is opposite to the case described above, the same advantages can be obtained by appropriately selecting the properties of the dielectric plate 3. It is already known that there are substrate materials whose dielectric constant varies with ambient temperature. Among those materials, substrates having various desired characteristics can be selected according to the intended use.

This embodiment adopts a substrate made of LFYD 150-030N40ES210 produced by Murata Manufacturing Co., Ltd.

The Gunn diode used in this embodiment has a characteristic in which its oscillation frequency changes by −75 ppm/° C. in response to a temperature rise.

Figure 1B:
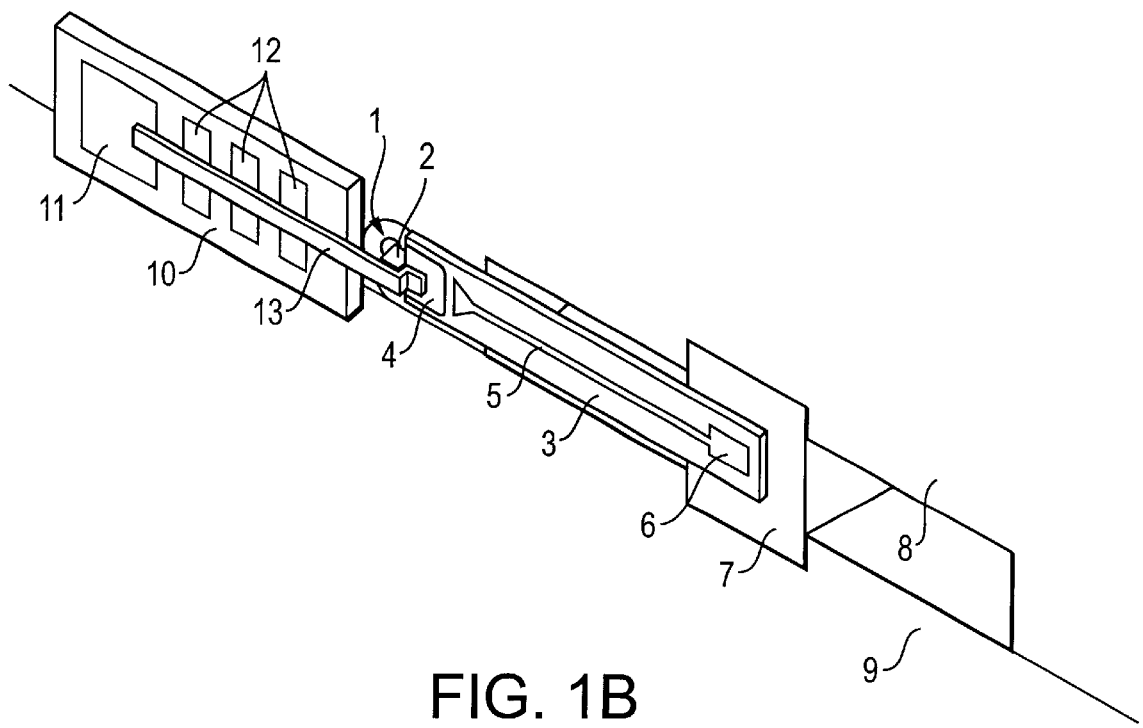
FIG. 1B is an enlarged view of the oscillator shown in FIG. 1A.

Based on the frequency-characteristic data of the Gunn diode, the oscillation frequency of the oscillator shown in FIGS. 1A and 1B at each temperature is calculated by a known circuit simulator. In other words, if the oscillation frequency of a Gunn diode at a certain temperature is found, the oscillation frequency of the oscillator can be calculated by taking into consideration known parameters such as the length and impedance of the strip line 5, the thickness and width of the dielectric plate 3, the conductivity of the strip line and the ambient temperature. Thus a curve of ambient temperature vs. output frequency is obtained. Then, a set of dielectric constants for the dielectric plate 3 is obtained which will reduce the changes in the oscillation frequency of the oscillator as much as possible over the entire temperature range. As a result, a curve showing the desired changes in dielectric constant to be exhibited by the dielectric plate 3 over the entire temperature range can be obtained.

Accordingly, the oscillator of the present invention can be obtained by selecting a material exhibiting such changes in its dielectric constant and producing the dielectric plate 3 with the selected material.

According to the present embodiment, it has been found that a dielectric material in which the dielectric constant decreases in response to a temperature rise by −182 ppm/° C. can be used with a Gunn diode having the above-described characteristics.

FIG. 3 shows a comparison between the temperature dependency of the oscillation frequency of the oscillator used in the foregoing embodiment and that of a conventional oscillator.

In the conventional oscillator, the dielectric constant of the dielectric plate 3 is substantially fixed over the entire temperature range. In the oscillator, when the temperature is 25° C., the oscillation frequency is 60 GHz, and when the temperature is 80° C., the oscillation frequency is 59.8 GHz. Thus, a frequency change of 0.2 GHz is observed.

In contrast, in the oscillator of the present embodiment, a frequency increase of only 0.01 GHz is seen.

Still referring to the first embodiment of the invention, the open end 6 of the strip line 5 is placed in such a manner that the oscillator electromagnetically couples to another transmission line. In this embodiment, as the other transmission line, a Hyper Nonradiative Dielectric Waveguide (hereinafter referred to as a Hyper NRD waveguide) is used. The Hyper NRD waveguide has good characteristics in terms of transmission efficiency of a high-frequency signal, low cost, low weight, etc.

According to the intended application of the device, other high-frequency transmission lines such as a Nonradiative Waveguide(NRD), a Dielectric Waveguide(DWG), and a suspended line can be used as well.

The structure of the Hyper NRD waveguide will be described below.

As is evident in FIGS. 1A and 2B, a strip 7, whose sectional view vertical to its extending direction is rectangular, is positioned between the upper and lower conductors 8 and 9. In FIG. 1A, the upper and lower conductors 8 and 9 farther forward than the oscillator (to the left in the Figure) are not shown. As seen in FIG. 2B, the upper and lower conductors 8 and 9 extend beyond the oscillator. The oscillator is embedded in the upper and lower conductors 8 and 9. Since the oscillator members 2, 5, 13, and the like are electrically conductive, the oscillator is embedded with the upper and lower conductors 8 and 9 out of electrical contact with these members. For example, a space may be disposed between the electrically conductive parts of the oscillator and the upper and lower conductors 8 and 9.

As a typical material for the strip 7, a resin such as Teflon (registered trademark for PTFE) can be used. Instead of the conductors 8 and 9, it is possible to use a conductive material applied to a surface of a dielectric plate. In short, as long as a pair of opposed conductive surfaces are disposed with the strip 7 between them, any other arrangement can be applied. A shallow groove is formed in the conductors 8 and 9 along a direction in which the strip extends so that a part of the strip 7 is fitted into the groove.

Preferably, the distance between the conductors 8 and 9 is equal to or less than a half of the wavelength of an electromagnetic wave transmitted via the strip 7. In such an arrangement, the region except the strip 7 between the conductors 8 and 9 is a region where the propagation of an electromagnetic wave is cut off. In addition, when the distance between the conductors 8 and 9 is adjusted to make the cut-off frequency of an LSM01 mode lower than the cut-off frequency of an LSE01 mode, only the LSM01 mode can be propagated through the strip 7.

The Hyper NRD waveguide and the oscillator are electromagnetically coupled to each other in proximity to the open end 6 of the strip line 5. The open end 6 and the strip 7 are electromagnetically coupled via the dielectric plate 3.

Near the coupling region, the dielectric plate 3 and the strip line 5 comprise a suspended line. The suspended line is extended toward the Gunn diode to reach the region where the back surface of the dielectric plate 3 opposes the conductors 8 and 9. In the region where the back surface of the dielectric plate opposes the conductors 8 and 9, a micro-strip line is formed by the conductors 8 and 9, the dielectric plate 3 in contact therewith, and the strip line 5.

In this way, the oscillation signal from the Gunn diode is guided to the Hyper NRD waveguide via the micro-strip line and the suspended line. The boundaries between these various types of lines can be regarded as line-conversion parts. Accordingly, in the oscillator of the present invention, the excitation waveguide additionally has a line-conversion function. In other words, by providing a single substrate for bridging between the oscillating element 1 and the transmission line 7, the temperature dependence of the oscillation frequency of the oscillator can be compensated for, and also line conversion can be provided between the oscillator and the NRD waveguide.

In this case, preferably, the distance between the strip line 5 and the upper conductor 8 and the distance between the strip line 5 and the lower conductor 9 are equal. The reason for this arrangement is so that the distribution of current induced in the conductors 8 and 9 by the oscillation signal propagating through the strip line 5 will be symmetrical between the upper and lower parts of the strip line, thereby suppressing the occurrence of a spurious-mode frequency, with the result that the line-conversion efficiency is improved.

Figure 4:
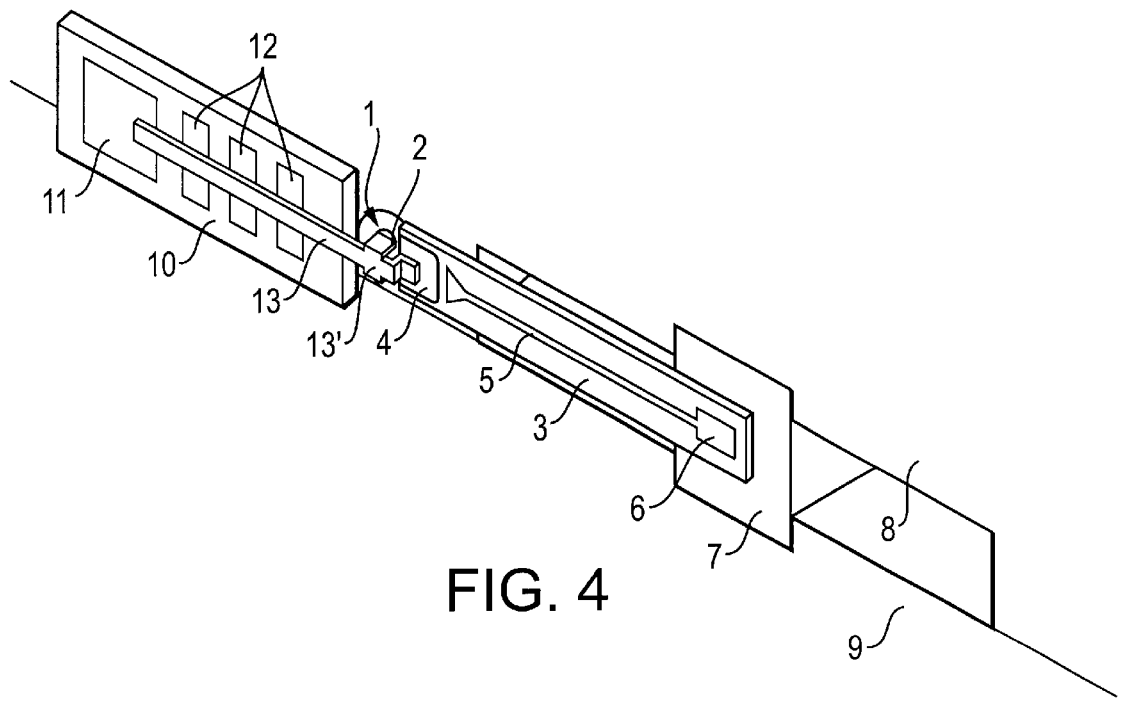
FIG. 4 is an inner-structure perspective view of an oscillator and a dielectric waveguide incorporating the same according to a second embodiment of the present invention.

FIG. 4 shows a second embodiment of the present invention. A top-end portion 13' of the lead plate 13 is shown in this embodiment. Thus, the structure of the lead plate 13 is a different part from that in the first embodiment. In the second embodiment, the lead plate 13 is formed of an elastic conductive material and at the end 13' thereof are disposed branches in such a manner that the branches embrace the output terminal 2 of the Gunn diode 1. This arrangement permits the lead plate 13 to be connected to the output terminal 2 without soldering. Therefore, during assembly of the device, the lead plate of a pre-assembled bias module only needs to be fitted onto the output terminal 2 at the end portion 13' of the lead plate. Soldering can additionally be used to obtain a more solid fitting.

Figure 5:
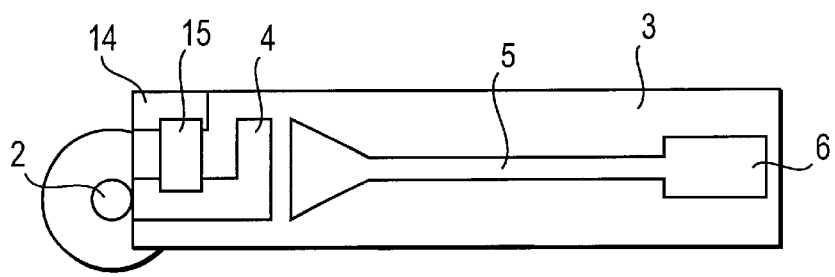
FIG. 5 is a plan view of the main part of an oscillator according to a third embodiment of the present invention.

FIG. 5 shows a third embodiment of the present invention. In this embodiment, there is provided a variable reactor 15 connected to the electrode 4. This arrangement is different from that in the first embodiment. The other end of the variable reactor 15 is connected to a ground electrode 14. As the variable reactor 15, it is possible to use a typical type of variable reactor such as a varactor diode or a Schottky barrier diode.

The oscillation frequency of the oscillator can be modulated by applying a modulation signal to the variable reactor 15. That is, a variable-oscillation-frequency oscillator can be produced. In general, since the temperature dependence in the characteristics of a variable reactor is small, no additional temperature-compensating circuit is necessary.

Figure 6:
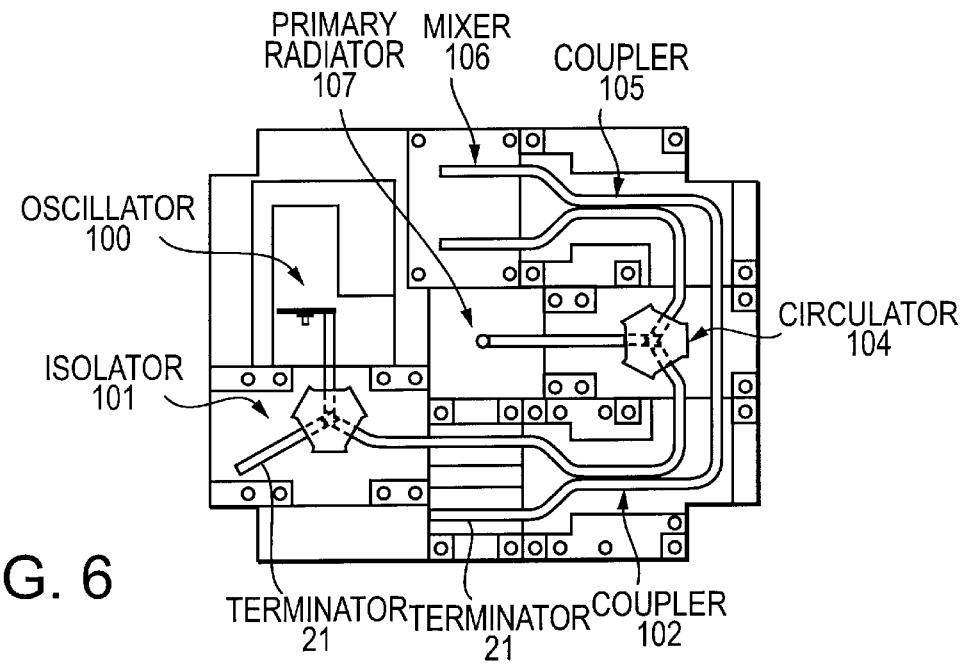
FIG. 6 is a plan view of a millimeter-wave radar module incorporating an oscillator according to an embodiment of the present invention.
Figure 7:
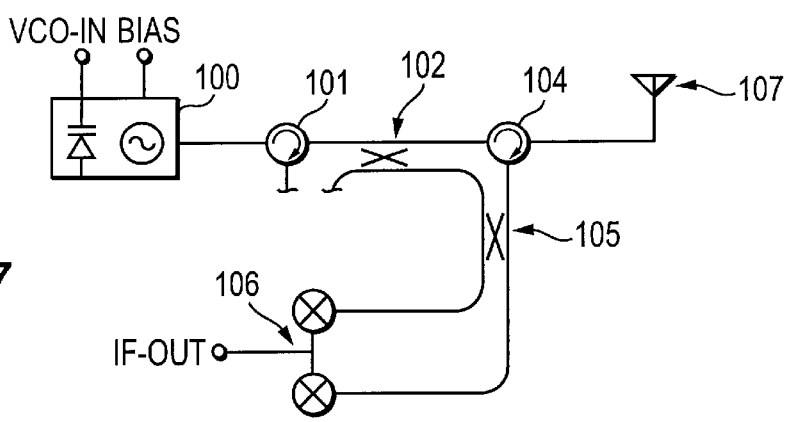
FIG. 7 is an equivalent circuit diagram of the module shown in FIG. 6.
Figure 8:
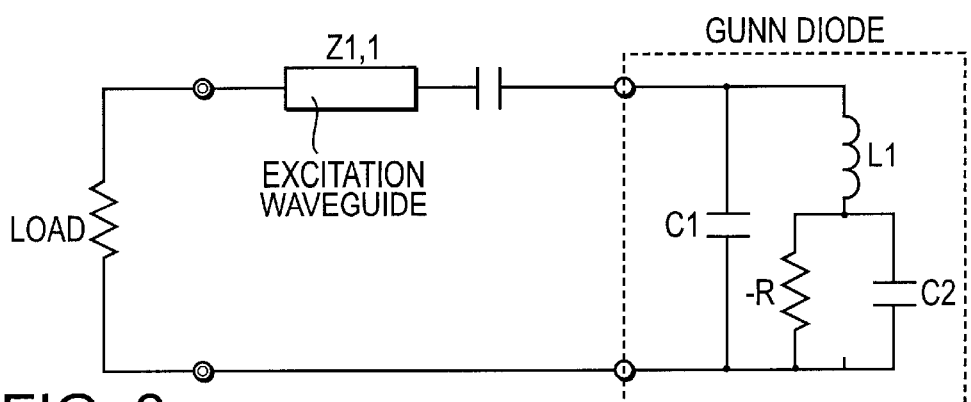
FIG. 8 is an equivalent circuit diagram of an oscillator using a Gunn diode according to the conventional art.
Figure 9:
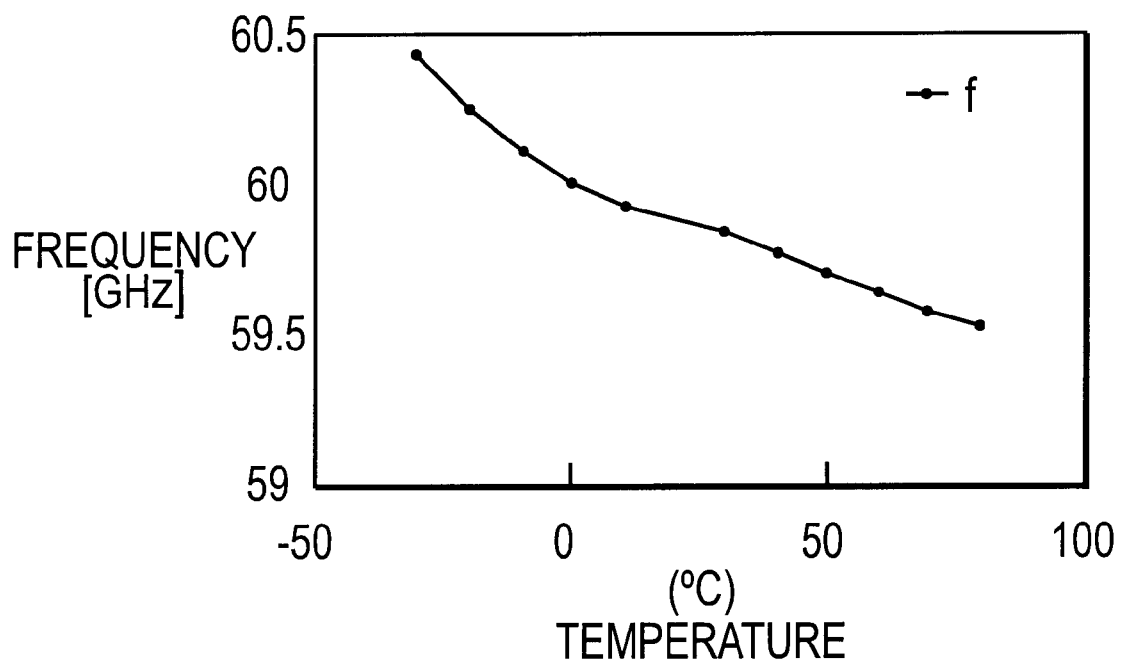
FIG. 9 is a graph showing the temperature dependence of the oscillation frequency of the oscillator using the Gunn diode of the conventional art.

As one example of an application of the above oscillators of FIGS. 1A–5, the structure of a millimeter-wave radar module will be described referring to FIGS. 6 and 7.

The module comprises sub-systems including an oscillator 100, an isolator 101, couplers 102 and 105, a circulator 104, a mixer 106, and a primary radiator 107. In each of the units, an NRD waveguide is used as a transmission waveguide. In other words, a dielectric strip line positioned between a lower conductor and an upper conductor of the module is used as the transmission waveguide. In FIG. 6, the upper conductor is omitted. The end of each NRD waveguide is fitted to an end of another one at the boundary of each sub-system. This allows signal transmission to be conducted between the modules.

In this embodiment, the oscillator shown in FIG. 5 is used in the oscillator 100. Other types of oscillators can be used in this invention. The oscillation signal is inputted to the isolator 101 via the NRD waveguide. The isolator 101 comprises a circulator and a terminator 21 for absorbing a reflected signal from the circulator. The two NRD waveguides are closely disposed in the coupler 102 adjacent to the isolator 101. In the coupler, a local signal Lo is extracted and is sent to the other coupler 105. Meanwhile, an oscillation signal is sent to the circulator 104 and is next sent to the primary radiator 107.

A signal received by the primary radiator 107 is sent to the coupler 105 via the circulator 104 so as to be coupled to the local signal. Balanced-type mixing is performed with respect to the two kinds of signals sent to the mixer 106 so as to obtain an intermediate frequency (IF) signal.

The above module has a controller, by which, for example, the oscillation frequency of the oscillator 100 is controlled to provide an FM-CW radar system and an IF signal is processed to measure distances.

Although non-limiting examples of the invention have been described, the invention is not limited to those examples, but extends to all modifications, variations and equivalents that would occur to those having the ordinary level of skill in the pertinent art.

What is claimed is:

1. An oscillator comprising:
   an oscillating element whose oscillation frequency exhibits temperature dependency;
   a dielectric substrate;
   a transmission line disposed on said dielectric substrate, said transmission line having an input section for receiving a signal output from the oscillating element and having an output section for outputting said signal;
   wherein the dielectric constant of the dielectric substrate exhibits temperature dependency in such a manner as to compensate for the temperature dependency of the oscillation frequency from the output section; and
   an output terminal connected to the oscillating element and disposed between the input section and the oscillating element while being separated from the input section.

2. An oscillator according to claim 1, wherein, in response to a temperature rise, the oscillation frequency of the oscillating element and the dielectric constant of the dielectric substrate are both reduced.

3. An oscillator according to claim 1, wherein the oscillating element is a Gunn diode.

4. An oscillator according to claim 1, further comprising a variable reactor connected to the output terminal.

5. An oscillator according to claim 1, wherein the input section has a tapered configuration widening toward the output terminal.

6. An oscillator according to claim 1, further comprising:
   a bias terminal for inputting a bias voltage applied to the oscillating element; and
   a filter disposed between the bias terminal and the oscillating element.

7. An oscillator comprising:
   an oscillating element whose oscillation frequency exhibits temperature dependency;
   a dielectric substrate;
   a transmission line disposed on said dielectric substrate, said transmission line having an input section for receiving a signal output from the oscillating element and having an output section for outputting said signal;
   wherein a dielectric constant of the dielectric substrate exhibits temperature dependency in such a manner as to compensate for the temperature dependency of the oscillation frequency from the output section;
   a bias terminal for inputting a bias voltage applied to the oscillating element;
   a filter disposed between the bias terminal and the oscillating element; and
   a unitary conductor in contact with the bias terminal, the filter, the oscillating element, and the output terminal.

8. An oscillator according to claim 7, further comprising a plurality of branches protruding from a part of the unitary conductor, which are folded to embrace the output section of the oscillating element together with the base part of the branches.

9. An oscillator comprising:
   an oscillating element whose oscillation frequency exhibits temperature dependency;
   a dielectric substrate;
   a transmission line disposed on said dielectric substrate, said transmission line having an input section for receiving a signal output from the oscillating element and having an output section for outputting said signal;
   wherein the dielectric constant of the dielectric substrate exhibits temperature dependency in such a manner as to compensate for the temperature dependency of the oscillation frequency from the output section; and
   a nonradiative dielectric waveguide electromagnetically coupled to the output section.

10. An oscillator according to claim 9, wherein the non-radiative dielectric waveguide comprises a dielectric strip electromagnetically coupled to the output section via the dielectric substrate and a pair of conductors individually disposed on the top and bottom of the dielectric strip.

11. An oscillator according to claim 10, wherein upper and lower parts of the dielectric strip are embedded respectively in a pair of grooves disposed in the upper and lower conductors and extending along the strip.

12. An oscillator according to claim 10, wherein the pair of conductors are joined near the oscillating element in such a manner that the oscillating element is embedded in the conductors.

13. An oscillator according to claim 9, further comprising a primary radiator electromagnetically coupled to the non-radiative dielectric waveguide at another end thereof.

* * * * *